United States Patent [19]
Yamazaki et al.

[11] Patent Number: 5,639,308
[45] Date of Patent: Jun. 17, 1997

[54] PLASMA APPARATUS

[75] Inventors: Yuichiro Yamazaki, Edogawa-ku; Motosuke Miyoshi, Minato-ku, both of Japan; Katsuya Okumura, Pouhkeepsie, N.Y.

[73] Assignee: Kabushiki Kaisha Toshiba, Kawasaki, Japan

[21] Appl. No.: 552,673

[22] Filed: Nov. 3, 1995

Related U.S. Application Data

[63] Continuation of Ser. No. 251,362, May 31, 1994, abandoned.

[30] Foreign Application Priority Data

May 31, 1993 [JP] Japan .................... 5-129002

[51] Int. Cl.$^6$ ............. C23C 16/48; C23F 1/02; H05H 1/16; H01J 27/20
[52] U.S. Cl. .................... 118/723 FE; 118/715; 118/723 R; 118/723 FI; 156/345; 204/298.31; 204/298.36; 204/298.37; 250/423 R; 315/111.41; 315/111.71; 315/111.81
[58] Field of Search .......... 118/723 R, 723 CB, 118/723 FE, 723 FI, 723 HC, 723 E, 723 ER, 715; 204/298.31, 298.34, 298.36, 298.37, 298.41, 298.05; 156/345; 250/423 R, 111.41, 111.71, 111.81

[56] References Cited

U.S. PATENT DOCUMENTS

| | | | |
|---|---|---|---|
| 4,657,619 | 4/1987 | O'Donnell | 204/298.37 |
| 4,749,910 | 6/1988 | Hara et al. | 204/298.36 |
| 5,009,922 | 4/1991 | Harano et al. | 427/571 |
| 5,217,761 | 6/1993 | Okada et al. | 118/723 |
| 5,340,621 | 8/1994 | Matsumoto et al. | 427/571 |

*Primary Examiner*—R. Bruce Breneman
*Assistant Examiner*—Rodney G. McDonald
*Attorney, Agent, or Firm*—Oblon, Spivak, McClelland, Maier & Neustadt, P.C.

[57] ABSTRACT

A plasma apparatus generates plasma by introducing electron beams into a processing chamber filled with a reactive gas for irradiation of the reactive gas with the introduced electron beams, to process a substance by the generated plasma. The plasma apparatus has a sample base for mounting the substance to be processed so that a processing surface of the substance is not directed in a direction perpendicular to a travel direction of the electron beams introduced into the processing chamber; a suppressing section for suppressing divergence of the electron beams introduced into the processing chamber; and a control section for controlling current density distribution of the divergence-suppressed electron beams so that current density distribution of ions contained in the plasma can be uniformalized on the substance to be processed.

5 Claims, 5 Drawing Sheets

PLASMA APPARATUS

This application is a Continuation of application Ser. No. 08/251,362, filed on May 31, 1994, now abandoned.

BACKGROUND OF THE INVENTION

1. Field of the Invention

The present invention relates to a plasma apparatus for generating plasma by irradiating electron beams introduced into a processing chamber upon a reactive gas to process a substance.

2. Description of the Prior Art

A conventional plasma apparatus will be first explained hereinbelow. When a glow discharge is generated between an anode and a cathode both arranged within a plasma generating chamber disposed in front of a processing chamber, a plasma can be generated from an argon gas introduced into the plasma generating chamber. Further, when ions in the generated plasm collide against the cathode, since the cathode is heated, thermoelectrons are generated from the cathode. The generated thermoelectrons allow the plasma into a further high density state. Within the plasma generating chamber, electrodes are further arranged to generate an electric field. The electrons in the generated plasma are further accelerated by the electric field generated between the electrodes into electron beams. The generated electron beams are introduced into a processing chamber.

The electron beams are irradiated upon a reactive gas introduced into the processing chamber, so that plasma is generated. Within the processing chamber, a semiconductor wafer is mounted on a sample base arranged in a direction perpendicular to the irradiation direction of the electron beams. Therefore, it is possible to process (e.g., etching, semiconductor film deposition, etc.) the wafer by the plasma generated within the processing chamber.

In the conventional plasma apparatus as described above, however, since the wafer is mounted in the direction perpendicular to the irradiation direction of the electron beams, the semiconductor wafer is irradiated with the electron beams roughly perpendicularly, so that there exists a problem in that ions enter deep into the wafer and thereby the wafer characteristics deteriorate.

To overcome this problem, another plasma apparatus has been proposed such that the wafer is mounted in the horizontal direction of the electron beam irradiation. In this conventional plasma apparatus by which the wafer is mounted horizontally in the electron beam irradiation direction, since the plasma generated over the wafer is not uniform in density, there arises another problem in that the wafer cannot be processed uniformly. The non-uniformity of the plasm density results from the non-uniformity of the density of the electron beams introduced into the processing chamber. In other words, the electron beams are high in density at the middle portion of the beams, but low at the outer peripheral portion thereof. It is of course possible to reduce the non-uniformity of the electron beam density by depressing the electron divergence due to collision against the reactive gas or due to the space charge effect. However, it is still difficult to process the wafer sufficiently uniform. The above-mentioned problem related to the non-uniform processing has recently become serious more and more with increasing diameter of the wafer.

SUMMARY OF THE INVENTION

With these problems in mind, therefore, it is the object of the present invention to provide a plasma apparatus which can generates plasma of uniform density so that a substance can be processed uniformly.

To achieve the above-mentioned object, the present invention provides a plasma apparatus for generating plasma by introducing electron beams into a processing chamber filled with a reactive gas for irradiation of the reactive gas with the introduced electron beams, to process a substance to be processed by the generated plasma, which comprises: a sample base for mounting the substance to be processed so that a processing surface of the substance is not directed in a direction perpendicular to a travel direction of the electron beams introduced into the processing chamber; suppressing means for suppressing divergence of the electron beams introduced into the processing chamber; and control means for controlling current density distribution of the divergence-suppressed electron beams so that current density distribution of ions contained in the plasma can be uniformalized on the substance to be processed.

In the plasma apparatus, said suppressing means may comprise at least one first magnet; said control means may comprise at least two second magnets disposed in opposition to said first magnet in relation to the substance to be processed; and said first and second magnets are arranged so that outgoing directions of magnetic force lines of said at least three magnets are the same with respect to each other, and further said at least two second magnets are spaced by a predetermined distance away from each other so that ion current density distribution of the plasma is uniformalized on the substance to be processed.

Further, in the plasma apparatus, said suppressing means may comprise at least one first magnet; said control means may comprise at least second and third electromagnets; and said plasma apparatus may further comprise deflecting means for deflecting the divergence-suppressed electron beams toward said second electromagnet by inverting polarities of said second and third electromagnets, when outgoing directions of magnetic force lines of said first magnet and said second electromagnet are the same with respect to each other; and for deflecting the divergence-suppressed electron beams toward said third electromagnet by inverting polarities of said second and third electromagnets, when outgoing directions of magnetic force lines of said first magnet and said third electromagnet are the same with respect to each other.

Further, in the plasma apparatus, said second and third electromagnets may be disposed in opposition to said first magnet in relation to the substance to be processed and further be spaced by a predetermined distance away from each other so that ion current density distribution of the plasma is uniformalized on the substance to be processed.

Further, in the plasma apparatus, said second and third electromagnets may be arranged on a side the same as said first magnet in relation to the substance to be processed.

DETAILED DESCRIPTION OF THE EMBODIMENTS

An embodiment of the plasma apparatus according to the present invention will be described hereinbelow with reference to FIG. 1

Figure 1:
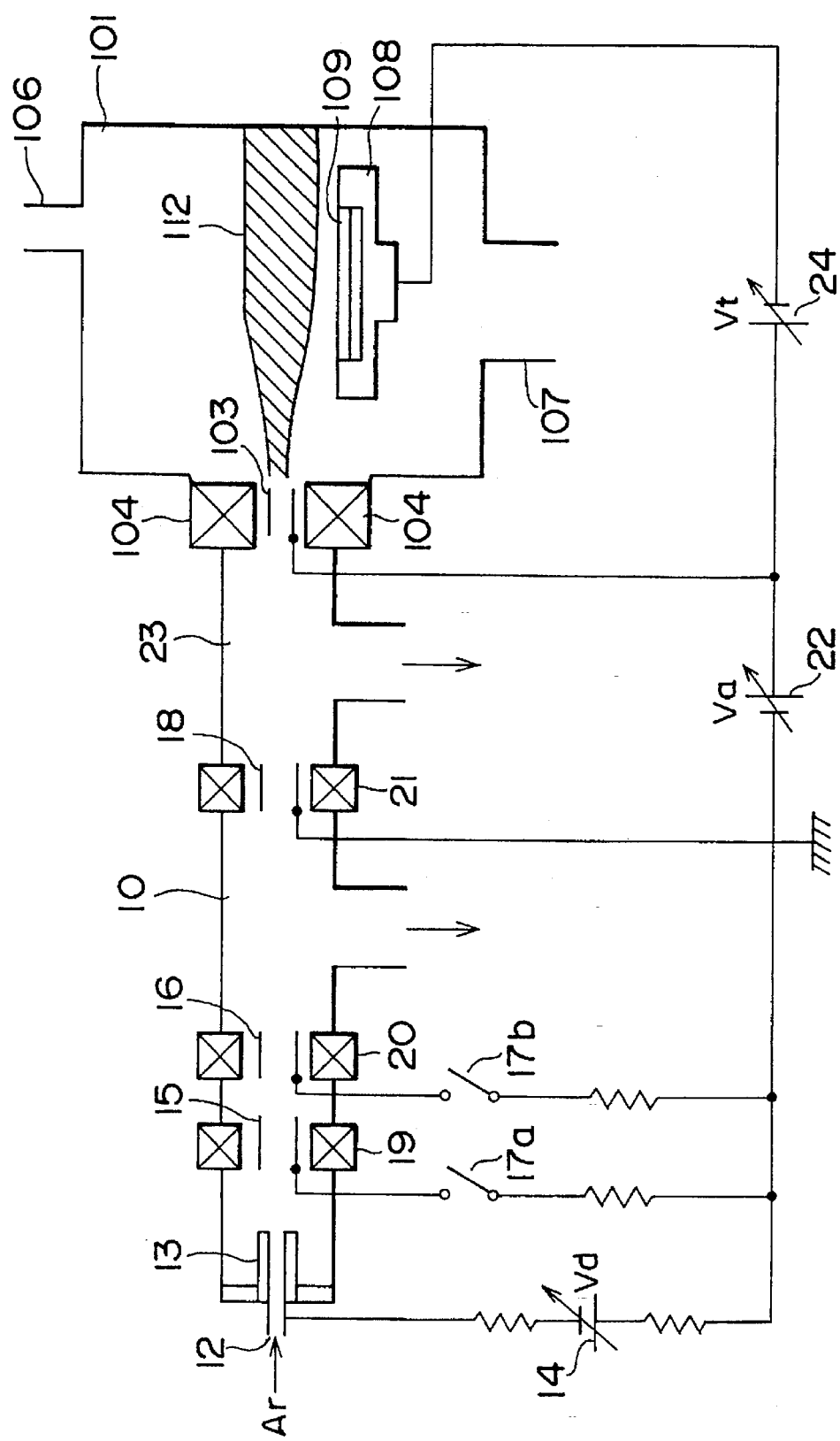
FIG. 1 is a partly sectional fragmentary schematic block diagram showing an embodiment of the plasma apparatus according to the present invention.

In FIG. 1, a voltage Vd is applied from a power source 14 to a cathode 13 formed of lanthanum boride ($L_aB_b$). Under these conditions, when switches 17a and 17b are closed, glow discharge is generated between the cathode 13 and an electrode 15, so that plasma can be generated in an argon (Ar) gas introduced into a chamber 10 through a gas introduction tube 12. When ions of the generated plasma collide against the cathode 13, since the cathode 13 is heated, thermoelectrons are emitted from the cathode 13. The emitted thermoelectrons further increase the density of the plasma.

When the cathode 13 has been heated, the switches 17a and 17b are both opened. After that, owing to the emission of the secondary electrons, the plasma can be maintained between the cathode 13 and another electrode 18. Here, the efficiency of the plasma passed through between the respective electrodes 15, 16 and 18 can be improved by providing electromagnets 19, 20 and 21 in back of the electrodes 15, 16 and 18, respectively.

Further, a positive potential difference Va is maintained between the electrode 18 and another electrode 103 by another power source 22. Therefore, an electric field can be formed in a space between the electrodes 18 and 103. The formed space is referred to as an acceleration portion 23. The electrons in the generated plasma are extracted into the acceleration portion 23, and further accelerated thereat into electron beams. The generated electron beams pass through the inside of the electrode 103, and then introduced into a processing chamber 101. Further, in back of the electrode 103, a cylindrical electromagnet 104 is disposed to suppress the divergence of the electron beams introduced into the processing chamber 101 due to space charge effect.

The processing chamber 101 is formed with gas charge opening 106 and a gas discharge opening 107, so that a reactive gas can be passed therethrough at a constant flow rate. Here, since the reactive gas is irradiated with the electron beams, plasma 112 can be generated within the processing chamber 101.

Within the processing chamber 101, a sample base 108 is provided. On this sample base, a semiconductor wafer 109 can be mounted in such a way as to be arranged in the direction parallel to the travel direction of the electron beams. Further, the mounted wafer 109 can be processed by applying a bias voltage Vt to the sample base 108 from a voltage supply 24. The processing implies etching, film deposition, etc.

Figure 2A:
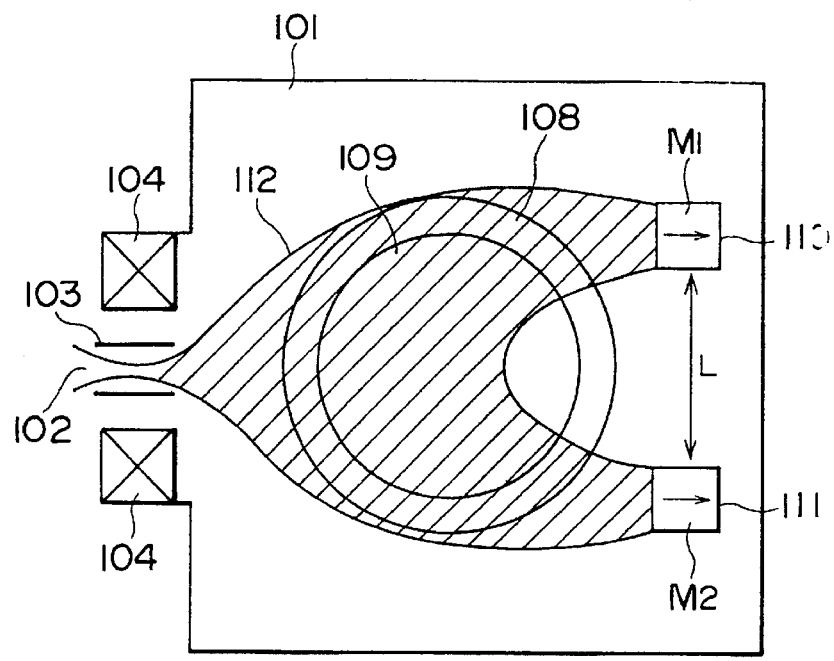
FIGS. 2A and 2B are top and side views, respectively, showing the essential portion of a first embodiment of the plasma apparatus according to the present invention.
Figure 2B:
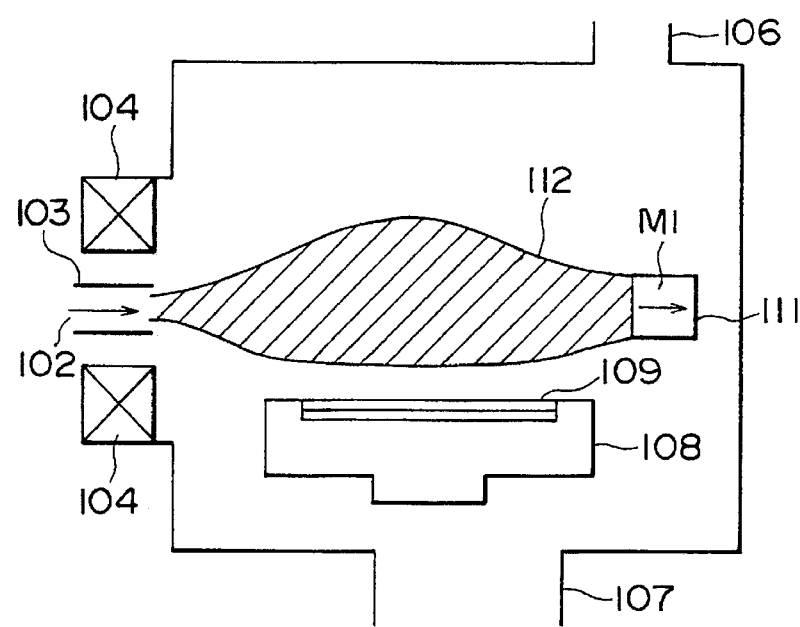

With reference to FIGS. 2A and 2B, the essential portion of a first embodiment of the plasma apparatus according to present invention will be described hereinbelow in further detail.

As shown in FIGS. 2A and 2B, the processing chamber 101 is formed with an electron beam introduction aperture 102 on one side surface thereof so that the electron beams can be introduced into the processing chamber 101. Further, an electrode 103 is provided inside of the electron introduction aperture 102 to accelerate the introduced electron beams. In addition, in back of this electrode 103, a cylindrical electromagnet 104 is disposed to suppress the divergence of the electron beams introduced into the processing chamber 101 due to the space charge effect.

Further, the processing chamber 101 is formed with a gas charge opening 106 and a gas discharge opening 107. A reactive gas is passed through the processing chamber 101 at a constant flow rate.

Further, within the processing chamber 101, a sample base 108 is provided. On this sample base 108, a semiconductor wafer 109 can be mounted in a direction parallel to the travel direction of the electron beams. A bias voltage Vt is applied to the sample base 108 by the voltage supply 24 as shown in FIG. 1.

Further, within the processing chamber 101, two magnets 110 and 111 formed of rare earth elements (whose surface magnetic flux density is more than 10 kilogauss, respectively) are arranged on the side remote from the electron beam introduction aperture 102. These magnets 110 and 111 are arranged so that outgoing directions of lines of magnetic forces generated by the magnets 110 and 111 are parallel to the processed surface of the wafer 109 and the magnets 110 and 111 are located as perpendicular to the travel direction of the electron beams. Further, in FIGS. 2A and 2B, symbols M1 and M2 denote the directions of the lines of magnetic forces generated by the magnets 110 and 111, respectively. Further, the directions of lines of the magnetic forces of the magnets 110 and 111 are the same as that of the electromagnet 104.

In the above-mentioned construction, the magnetic force lines generated by the electromagnet 104 are branched into two directions by the influence of the two magnets 110 and 111, and then reach the respective magnets 110 and 111, as shown in FIG. 2A. Here, owing to the branch of the magnetic field, the current density distribution of the electron beams introduced through the electron introduction aperture 102 is also branched, so that it is possible to obtain branched plasma 112 as shown. Therefore, when the semiconductor wafer 109 is disposed at a position slightly away from the plasma, since the distribution of the ion current density over the wafer 109 is uniformalized by the diffusion of the branched plasma, it is possible to process the wafer 109 uniformly.

In other words, when the magnets 110 and 111 are not provided, the current density of the electron beams is high in the middle portion of the electron beams but low in the peripheral portion thereof, with the result that the ion current density over the wafer 109 is also not uniform. In the present invention, however, since the magnets 110 and 111 are provided, the plasma can be diffused, so that it is possible to obtain a uniform ion current density over the wafer 109.

To obtain the uniform ion current density as described above, the spread of the branched lines of the magnetic force is controlled by changing the interval L between the two magnets 110 and 111. Here, the spread of the magnetic force lines implies the width of the distribution of the magnetic field intensity as shown by a dashed portion in FIG. 2A.

Figure 3:
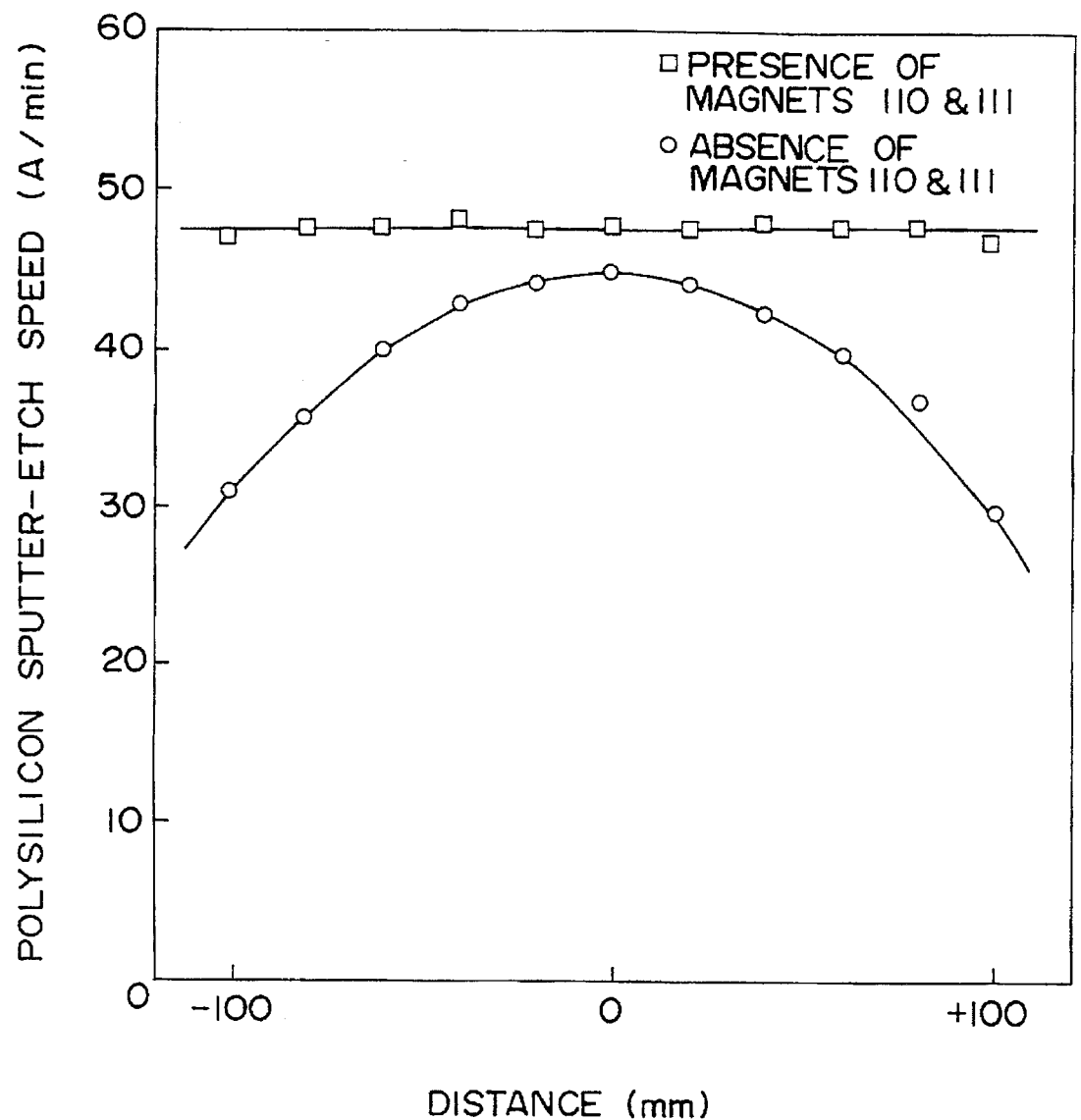
FIG. 3 is a graphical representation for assistance in explaining the uniformity of the etching process speed when the plasma apparatus shown in FIGS. 2A and 2B is used.

FIG. 3 shows the distribution of the etching speed obtained when the semiconductor wafer is sputter-etched with the use of the plasma apparatus as described above. In FIG. 3, the abscissa designates positions on the wafer 109 from the middle point [0] in the direction perpendicular to the travel direction of the electron beams, and the ordinate designates the etching speed obtained when the polysilicon on the wafer 109 is sputter-etched.

FIG. 3 indicates that where no magnets are provided, since the plasma density is high near the middle portion of the wafer, the etching speed is high thereat; on the other hand, since the plasma density is low near the outer peripheral portion thereof, the etching speed is low thereat. As a result, there exists an etching speed difference more than 40% between the middle portion and a portion 100 mm away from the middle portion. In contrast with this, in the plasma apparatus according to the present invention, since the plasma density is uniformalized, it is possible to reduce the non-uniformity of the etching speed down to about 5%.

Further, in this embodiment, it is also possible to increase the etching speed all over the wafer. This may be due to the fact that since the electron beams are restricted by the magnetic field, the plasma density can be increased.

Further, in this embodiment, although two magnets 110 and 111 are used, it is of course possible to use three or more magnets instead of the two magnets. Or else, the same effect can be obtained by use of such a single magnet that the magnetic field intensity thereof has a gradient in the magnet surface. Further, electromagnets can be also used instead of the permanent magnets.

Further, in this embodiment, although the magnets 110 and 111 are both arranged within the processing chamber 101, it is possible to install these magnets outside the processing chamber 101. In this case, since the magnets 110 and 111 are not exposed to the generated plasma, there exist such advantages that the magnetic characteristics of the magnets can be prevented from deterioration and in addition the apparatus structure can be simplified.

Figure 4A:
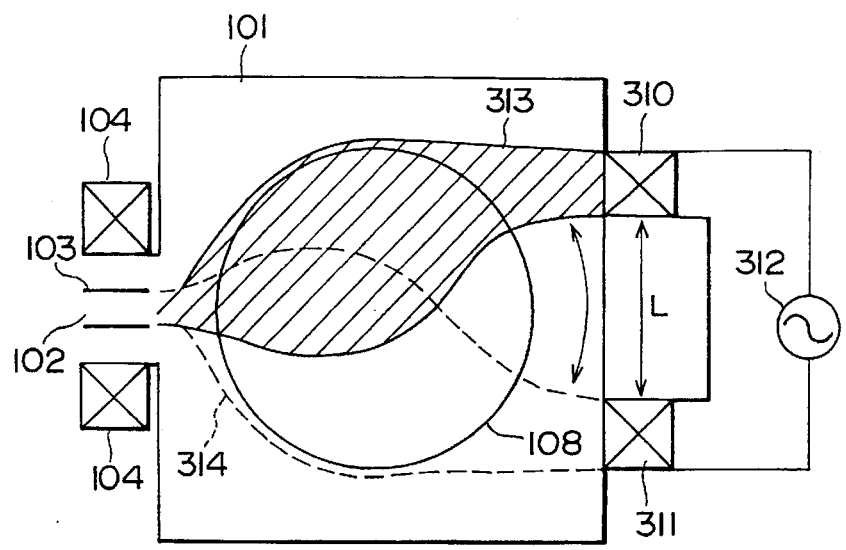
FIGS. 4A and 4B are top and side views, respectively, showing the essential portion of a second embodiment of the plasma apparatus according to the present invention.
Figure 4B:
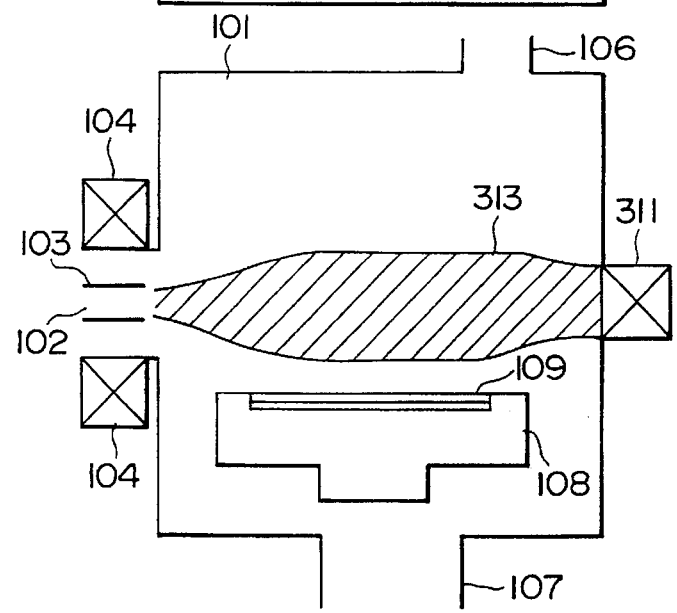

A second embodiment of the essential portion of the plasma apparatus according to the present invention will be described in detail hereinbelow with reference to FIGS. 4A and 4B. In FIGS. 4A and 4B, the same reference numerals have been retained for the similar elements or parts which have the same functions as in FIGS. 3A and 3B, without repeating any detailed description thereof.

In FIGS. 4A and 4B, two electromagnets 310 and 311 are disposed on the outside surface of the processing chamber 101 and on the side remote from the electron introduction aperture 102. These two electromagnets 310 and 311 are arranged so that outgoing directions of lines of magnetic forces generated by the electromagnets 310 and 311 are parallel to the processed surface of the wafer 309 and the magnets 310 and 311 are located as perpendicular to the travel direction of the electron beams, as shown in FIG. 4A.

The coils of the respective electromagnets 310 and 311 are wound in such winding directions that the polarities thereof become opposite to each other. These electromagnets 310 and 311 are connected to a constant alternating current source 312.

In this plasma apparatus, the polarities of the electromagnets 310 and 311 are inverted periodically on the basis of phase of the alternating current (AC) supplied by the source 312. In more detail, when the polarity of the electromagnet 310 is N pole, that of the electromagnet 311 is S pole, and when the polarity of the electromagnet 310 is S pole, that of the electromagnet 311 is N pole.

In the case where the direction of the magnetic force lines of the electromagnet 310 is the same as that of the magnetic force lines of the cylindrical electromagnet 104, the magnetic force lines generated by the cylindrical electromagnet 104 reach the electromagnet 310. Therefore, the electron beams introduced into the processing chamber 101 is deflected toward the electromagnet 310, with the result that a plasma distribution 313 (as shown by solid lines in FIG. 4A) can be obtained. Here, when the polarity of the electromagnet 310 or 311 is inverted and thereby the direction of the magnetic force lines of the electromagnet 311 is the same as that of the magnetic force lines of the cylindrical electromagnet 104, since the magnetic force lines generated by the cylindrical electromagnet 104 reach the electromagnet 311, the electron beams introduced into the processing chamber 101 are deflected toward the electromagnet 311, with the result that a plasma distribution 314 (as shown by dashed lines in FIG. 4A) can be obtained. As described above, since the plasma distribution can be changed by scanning the electron beam path, the ion current density can be more uniformalized, so that it is possible to process the wafer 109 more uniformly.

In this embodiment, the deflection of the magnetic force lines; that is, the distribution width of the magnetic field intensity (the shaded portion in FIG. 4A) can be controlled by changing the distance L between the two electromagnets 310 and 311 so that the uniform ion current density can be obtained.

In the plasma apparatus of this embodiment, it is possible to etch the wafer uniformly in the same way as with the case shown in FIG. 3, so that the etching speed can be increased.

Further, in this embodiment, although only a single electromagnet 310 or 311 is used to deflect the magnetic force lines toward one side, it is also preferable to use two or more electromagnets to defect the magnetic force lines toward any one of both the sides, respectively. Further, although the electromagnets 310 and 311 are disposed outside the processing chamber 101, it is of course possible to arrange these within the processing chamber 101.

Further, in this embodiment, the alternating current source 312 is used to invert the polarity of the electromagnets 310 and 311 periodically. Without being limited thereto, however, any means can be used as far as a plurality of the electromagnets can be energized periodically.

Figure 5A:
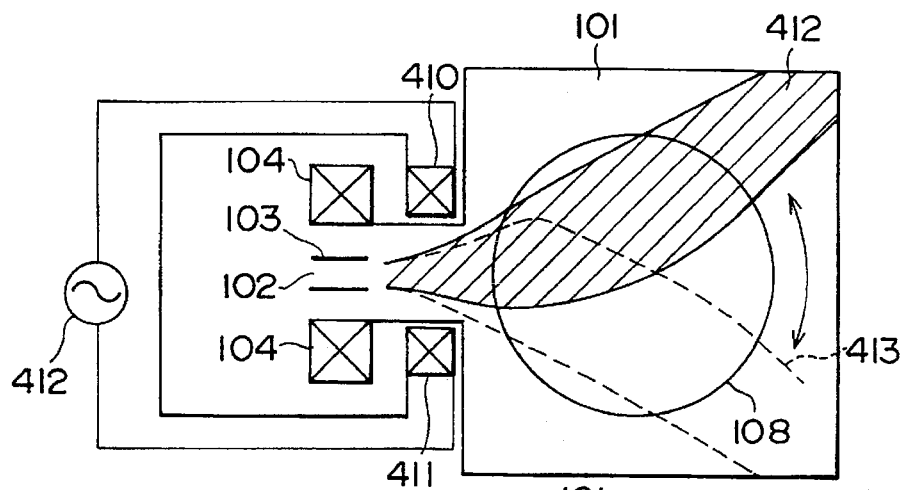
FIGS. 5A and 5B are top and side views, respectively, showing the essential portion of a third embodiment of the plasma apparatus according to the present invention.
Figure 5B:
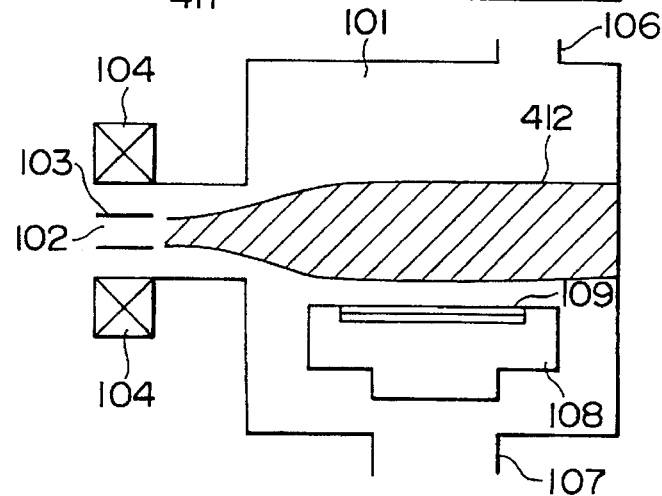

A third embodiment of the essential portion of the plasma apparatus according to the present invention will be described in detail hereinbelow with reference to FIGS. 5A and 5B. In FIGS. 5A and 5B, the same reference numerals have been retained for the similar elements or parts which have the same functions as in FIGS. 3A and 3B, without repeating any detailed description thereof.

In FIGS. 5A and 5B, two electromagnets 410 and 411 are disposed between the electromagnet 104 and the side wall (on the left side) of the processing chamber 101. As shown in FIG. 5A, these electromagnets 410 and 411 are provided parallel to the surface of the wafer 109 to be processed. Further, the coils of the respective electromagnets 310 and 311 are wound in such winding directions that the polarities thereof become opposite to each other. These electromagnets 410 and 411 are connected to a constant alternating current source 412.

In the same way as with the case of the second embodiment, the polarities of the electromagnets 410 and 411 are inverted periodically on the basis of phase of the alternating current (AC) supplied by the source 412. In more detail, when the polarity of the electromagnet 410 is N pole, that of the electromagnet 411 is S pole, and when the polarity of the electromagnet 410 is S pole, that of the electromagnet 411 is N pole.

In the case where the polarity of the electromagnet 410 is S pole and that of the electromagnet 411 is N pole, an axially symmetrical magnetic field generated by the cylindrical electromagnet 104 is distorted by the two electromagnets 410 and 411. Therefore, the electron beams introduced into the processing chamber 101 are deflected toward the electromagnet 410, with the result that a plasma distribution 412

(as shown by shaded lines in FIG. 5A) can be obtained. Here, when the polarities of the electromagnets 410 and 411 are inverted so that the polarity of the electromagnet 410 is N pole and that of the electromagnet 411 is S pole, since the electron beams introduced into the processing chamber 101 is deflected toward the electromagnet 411, with the result that a plasma distribution 413 (as shown by dashed lines in FIG. 5A) can be obtained because the electron beam path changes. As described above, since the plasma distribution can be changed due to the change of the electron beam path, it is possible to obtain a uniform plasma distribution and thereby the wafer 109 can be processed uniformly.

In the plasma apparatus of this embodiment, it is possible to etch the wafer uniformly in the same way as in FIG. 3, so that the etching speed can be increased.

Further, In this embodiment, the deflection of the electron beams; that is, the distribution width of the magnetic field intensity (the shaded portion in FIG. 5A) can be controlled by changing the magnetic field intensity between the two electromagnets 410 and 411. In other words, the deflection of the electron beams can be controlled by changing the amplitudes of the exciting currents passed through the electromagnets 410 and 411 respectively, so that the control can be simplified.

Further, in this embodiment, since the axially symmetrical magnetic field generated by the cylindrical electromagnet 404 can be distorted by use of only two electromagnets 410 and 411, the magnetic field intensities of the electromagnets 410 and 411 are small as compared with that of the first and second embodiments, so that the apparatus construction can be simplified to that extent.

Further, in this embodiment, although only a single electromagnet 410 or 411 is used to deflect the magnetic force lines toward one side, it is also preferable to use two or more electromagnets to defect the magnetic force lines toward one side, respectively.

Further, in the above-mentioned embodiments, the plasma apparatus of the present invention is applied to the sputter-etching processing. Without being limited thereto, it is of course possible to obtain the same effect as above, when the plasma apparatus according to the present invention is used to process the wafer in different ways.

What is claimed is:

1. A plasma apparatus for generating plasma by introducing electron beams into a processing chamber filled with a reactive gas for irradiation of the reactive gas with the introduced electron beams, to process a substrate to be processed by the generated plasma, which comprises:

a sample base for mounting the substrate so that a processing surface of the substrate is not directed in a direction perpendicular to a travel direction of the electron beams introduced into the processing chamber;

at least one first magnet placed on an electron beam entrance side of the processing chamber, for suppressing divergence of the electron beams introduced into the processing chamber; and at least second and third magnets disposed on an opposite side of the substrate from said first magnet, said second and third magnets being spaced by a distance away from each other, for controlling current density distribution of the divergence-suppressed electron beams so that current density distribution of ions contained in the plasma can be uniformalized on the substrate, wherein said first, second and third magnets are arranged so that outgoing directions of magnetic force lines of said first magnet are the same as outgoing directions of magnetic force lines of said second and third magnets.

2. A plasma apparatus for generating plasma by introducing electron beams into a processing chamber filled with a reactive gas for irradiation of the reactive gas with the introduced electron beams, to process a substrate to be processed by the generated plasma, which comprises:

a sample base for mounting the substrate so that a processing surface of the substrate is not directed in a direction perpendicular to a travel direction of the electron beams introduced into the processing chamber;

at least one first magnet for suppressing divergence of the electron beams introduced into the processing chamber;

at least first and second electromagnets spaced by a distance away from each other for controlling current density distribution of the divergence-suppressed electron beams so that current density distribution of ions contained in the plasma can be uniformalized on the substrate to be processed; and deflecting means for deflecting the divergence-suppressed electron beams toward said first electromagnet by inverting polarities of said first and second electromagnets, when outgoing directions of magnetic force lines of said first magnet and said first electromagnet are the same; and for deflecting the divergence-suppressed electron beams toward said second electromagnet by inverting polarities of said first and second electromagnets, when outgoing directions of magnetic force of said first magnet and said second electromagnet are the same.

3. The plasma apparatus of claim 2, wherein said first and second electromagnets are disposed in opposition to said first magnet in relation to the substrate to be processed.

4. The plasma apparatus of claim 2, wherein said first and second electromagnets are arranged on a side the same as said first magnet in relation to the substrate to be processed.

5. A plasma apparatus for generating plasma by introducing electron beams into a processing chamber filled with a reactive gas for irradiation of the reactive gas with the introduced electron beams, to process a substrate to be processed by the generated plasma, which comprises:

a sample base for mounting the substrate so that a processing surface of the substrate is not directed in a direction perpendicular to a travel direction of the electron beam introduced into the processing chamber;

at least one first magnet placed on an electron beam entrance side of the processing chamber, for suppressing divergence of the electron beams introduced into the processing chamber; and at least second and third magnets spaced by a distance away from each other, for controlling current density distribution of the divergence-suppressed electron beams so that current density distribution of ions contained in the plasma can be uniformalized on the substrate, wherein the substrate is mounted on the sample base so that the substrate is separated from and substantially parallel to a plane passing through said first, second and third magnets and the substrate is substantially within a projection of an area bounded by the magnets;

wherein the outgoing directions of magnetic force lines of said first magnet are the same as outgoing directions of magnetic force lines of said second and third magnets.

* * * * *